United States Patent [19]
Ushiroku et al.

[11] Patent Number: 5,770,985
[45] Date of Patent: Jun. 23, 1998

[54] SURFACE ACOUSTIC WAVE FILTER

[75] Inventors: Tadamasa Ushiroku; Hideharu Ieki, both of Nagaokakyo, Japan

[73] Assignee: Murata Manufacturing Co., Ltd., Japan

[21] Appl. No.: 671,086

[22] Filed: Jun. 27, 1996

Related U.S. Application Data

[63] Continuation of Ser. No. 272,151, Jul. 8, 1994, abandoned.

[30] Foreign Application Priority Data

Jul. 8, 1993 [JP] Japan .................................. 5-169001

[51] Int. Cl.⁶ .................................................. H03H 9/64
[52] U.S. Cl. ...................... 333/193; 333/195; 310/313 R
[58] Field of Search .................................. 333/193–196; 310/131 R, 313 B

[56] References Cited

U.S. PATENT DOCUMENTS

| | | |
|---|---|---|
| 4,166,258 | 8/1979 | Tseng . |
| 4,492,940 | 1/1985 | Hikita ...................................... 333/195 |
| 4,542,356 | 9/1985 | Nakazawa et al. ...................... 333/195 |
| 4,734,664 | 3/1988 | Hikita et al. .............................. 33/193 |
| 5,010,269 | 4/1991 | Hikita et al. ............................. 333/195 |
| 5,115,216 | 5/1992 | Hikita et al. .............................. 33/195 |
| 5,202,652 | 4/1993 | Tabuchi et al. .......................... 333/193 |
| 5,204,575 | 4/1993 | Kanda et al. ............................ 333/195 |
| 5,223,762 | 6/1993 | Masaie et al. ........................... 333/195 |
| 5,521,453 | 5/1996 | Yatsuda .................................... 333/193 |

FOREIGN PATENT DOCUMENTS

| | | |
|---|---|---|
| 0600705 | 6/1994 | European Pat. Off. ............... 333/195 |
| 5210944 | 2/1977 | Japan . |
| 5219044 | 2/1977 | Japan . |
| 0054805 | 3/1989 | Japan ..................................... 333/195 |
| 0222512 | 10/1991 | Japan ..................................... 333/195 |
| 3222512 | 10/1991 | Japan . |
| 2116387 | 9/1983 | United Kingdom . |

OTHER PUBLICATIONS

Patent Abstract of Japan, vo. 15, No. 510 (E–1149) 25 Dec. 1991 & JP–A–03 222 512 (OKI Electric) 1 Oct. 1991 (Abstract).
Co–pending U.S. Patent Application No. 08/271,195.
IEEE Transactions on Microwave Theory And Techniques, "Miniature SAW Antenna Duplexer for 800 –MHz Portable Telephone Used in Cellular in Cellular Radio Systems", vol.36, No. 6, Jun. 1988, New York, pp. 1047–1056.
English Translation of Japan Patent 52–10944.

*Primary Examiner*—Robert Pascal
*Attorney, Agent, or Firm*—Ostrolenk, Faber, Gerb & Soffen, LLP

[57] ABSTRACT

A surface acoustic wave (SAW) filter includes a plurality of interdigital transducers located on a piezoelectric substrate along a surface wave propagation direction, at least a single one–port SAW resonator being connected in parallel with an output side of the SAW filter, while the resonance frequency ($f_o$) of the SAW resonator is set in frequency region level which is lower than the pass band of the SAW filter.

10 Claims, 8 Drawing Sheets

SURFACE ACOUSTIC WAVE FILTER

This is a Continuation of application Ser. No. 08/272,151 filed on July 8, 1994, now abandoned.

BACKGROUND OF THE INVENTION

1. Field of the Invention

The present invention relates to a surface acoustic wave filter (hereinafter referred to as a SAW filter) comprising a plurality of interdigital transducers (hereinafter referred to as IDTs) which are arranged on a piezoelectric substrate along a surface wave propagation direction, and more particularly, the present invention relates to a SAW filter having a structure capable of increasing the amount of attenuation in the vicinity of its pass band.

2. Description of the Background Art

A SAW filter is characterized in that the filter is relatively small and has steep filter characteristics. In general, therefore, SAW filters of various structures have been proposed and put into practice.

FIG. 1 is a schematic plan view showing a three IDT type SAW filter 1 as an exemplary conventional surface acoustic wave filter. The SAW filter 1 comprises three IDTs 3 to 5 which are arranged on a rectangular piezoelectric substrate 2. Numerals 6 and 7 denote reflectors. In the SAW filter 1, first comb electrodes of the IDTs 3 and 5 are commonly connected to define an input end, while a first comb electrode of the IDT 4 serves as an output end. Second comb electrodes of the IDTs 3 and 5 are connected to ground potentials.

FIG. 2 is a schematic plan view showing another exemplary conventional SAW filter 8. The SAW filter 8 comprises two IDTs 9 and 10 which are arranged on an upper surface of a piezoelectric substrate 2 along a surface wave propagation direction. Reflectors 6 and 7 are arranged on both sides of the IDTs 9 and 10. In such a two IDT type SAW filter 8, first comb electrodes of the IDTs 9 and 10 are employed as input and output ends, respectively. Second comb electrodes of the IDTs 9 and 10 are connected to earth potentials.

FIG. 3 is a schematic plan view showing still another exemplary conventional SAW filter 11. The SAW filter 11, called an interdigited interdigital type (hereinafter reffered to as IIDT type) SAW filter, comprises seven IDTs 12 to 18 which are arranged on an upper surface of a rectangular substrate 2 along a surface wave propagation direction. First comb electrodes of the IDTs 12, 14, 16 and 18 are commonly connected to be employed as an input end, while first comb electrodes of the IDTs 13, 15 and 17 are commonly connected to be employed as an output end. Second comb electrodes of the IDTs 12 to 18 are connected to respective ground potentials.

In such an IIDT type SAW filter 11 which is formed by arranging a number of IDTs 12 to 18, it is possible to reduce insertion loss.

As hereinabove described, various structures of SAW filters have been proposed for reducing insertion loss. When reduction of insertion loss is desired in a SAW filter, however, an amount of attenuation cannot be significantly increased in the vicinity of its pass band. Particularly in a SAW filter employing the aforementioned surface acaustic wave resonator, the amount of attenuation is reduced in the vicinity of its pass band.

In order to increase the amount of attenuation in the vicinity of the pass band, the number of stages of the SAW filter may be increased to attain multistage connection. When the number of stages of the SAW filter is increased, however, insertion loss is disadvantageously increased in proportion to the number of stages.

Thus, conventional devices have failed to provide a SAW filter which can increase the amount of attenuation in the vicinity of its pass band without increasing insertion loss. Particularly in a mobile communication device such as a portable telephone, the frequency space between transmission and receiving sides is so narrow that it is necessary to ensure a sufficient amount of attenuation in the vicinity of the pass band. However, it has been difficult to satisfy such a requirement in the conventional SAW filter.

SUMMARY OF THE INVENTION

An object of at least one of the preferred embodiments of the present invention is to provide a SAW filter having a structure which can increase an amount of attenuation in the vicinity of its pass band, particularly on a frequency region lower than the pass band.

The SAW filter according to at least one of the preferred embodiments of the present invention comprises a piezoelectric substrate, and a plurality of interdigital transducers which are formed on the piezoelectric substrate to be arranged along a surface wave propagation direction. The plurality of interdigital transducers are adapted to form a SAW filter part. The inventive SAW filter further comprises at least a single one-port SAW resonator having at least one interdigital transducer, which is connected in parallel with at least one of input and output sides of the SAW filter part, and the resonance frequency of the one-port SAW resonator is set in a frequency region which is lower than the pass band of the SAW filter part.

The aforementioned SAW filter part formed by a plurality of IDTs which are arranged on a piezoelectric substrate along the surface wave propagation direction also includes an IIDT type SAW filter, in addition to the aforementioned two IDT type or three IDT type SAW filter. At least one of the preferred embodiments of the present invention is characterized in that at least a single one-port SAW resonator is connected in parallel with such a SAW filter part as hereinabove described.

According to at least one of the preferred embodiments of the the present invention, at least a single one-port SAW resonator is connected in parallel with at least one of input and output sides of the SAW filter part. This one-port SAW resonator is structured so that its resonance frequency $f_0$ is set in a frequency region which is lower than the pass band of the SAW filter part. In the pass band characteristics of the overall SAW filter, the amount of attenuation on a frequency region lower than the pass band is increased since a resonance point of the one-port SAW resonator is located at a frequency level which is lower than the pass band.

Thus, the amount of attenuation in an attenuation area is increased as compared with the pass band, whereby steepness of the filter characteristics is increased. Thus, it is possible to provide a SAW filter which is suitably applicable to an apparatus such as a portable telephone having a narrow frequency space between transmission and receiving sides, for example.

According to another aspect of at least one of the preferred embodiments of the present invention, the piezoelectric substrate is formed by a 36° Y cut-LiTaO$_3$ substrate, and the IDT of the one-port SAW resonator is structured so that the following equation (1) is satisfied when the saw filter is provided with a single such one-port SAW resonator:

$$\frac{N \times A}{f_0} \leq 30 \tag{1}$$

while the sum of $(N \times A)/f_0$ of respective resonators is not more than 30 when the SAW filter is provided with a plurality of such one-port SAW resonators, assuming that $f_0$ (MHz) represents the resonance frequency of the one-port SAW resonator, N represents the number of pairs of electrode fingers, and A ($\mu$m) represents an overlap length.

According to this aspect of the present invention, the one-port SAW resonator is structured to satisfy the above equation (1) in the SAW filter employing the piezoelectric substrate comprising 36° Y cut-LiTaO$_3$, whereby it is possible to effectively improve the amount of attenuation in a frequency region lower than the pass band without significantly increasing insertion loss, as clearly understood from embodiments described later.

According to another aspect of at least one of the preferred embodiments of the present invention, the piezoelectric substrate comprises of 64° Y cut-LiNbO$_3$, and the IDT of the one-port SAW resonator is structured so that the following equation (2) is satisfied when the SAW filter is provided with a single such one-port SAW resonator:

$$\frac{N \times A}{f_0} \leq 45 \tag{2}$$

while the sum of $(N \times A)/f_0$ of respective SAW resonators is not more than 45 when the SAW filter is provided with a plurality of such one-port SAW resonators, assuming that $f_0$ (MHz) represents the resonance frequency of the one-port SAW resonator, N represents the number of pairs of electrode fingers, and A ($\mu$m) represents an overlap length.

According to this aspect of the present invention, the one-port SAW resonator is structured to satisfy the above equation (2) in the SAW filter employing a Y cut-LiTaO$_3$ substrate, whereby it is possible to remarkably improve the amount of attenuation in a frequency region lower than the pass band without significantly increasing insertion loss, similarly to the structure satisfying the equation (1).

The above equations (1) and (2) have been theoretically confirmed by the inventor, as clearly understood from the embodiments described later.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Preferred embodiments of the present invention are now described with reference to the accompanying drawings, to clarify the present invention.

Figure 4:
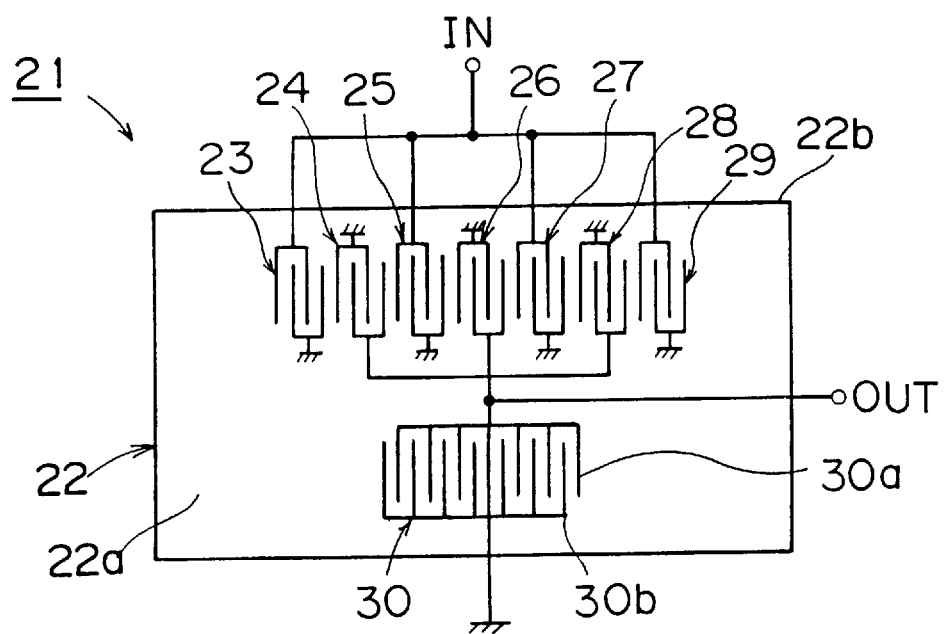
FIG. 4 is a schematic plan view for illustrating a SAW filter according to a first preferred embodiment of the present invention.

FIG. 4 is a schematic plan view showing a SAW filter 21 according to a first preferred embodiment of the present invention. The SAW filter 21 is composed by a rectangular piezoelectric substrate 22. On an upper surface 22a of the piezoelectric substrate 22, a plurality of IDTs 23 to 29 are arranged on an edge 22b side along a surface wave propagation direction.

The IDTs 23 to 29 are adapted to form an IIDT type SAW filter part. First comb electrodes of the IDTs 23, 25, 27 and 29 are commonly connected as shown in FIG. 4, to define an input end. Second comb electrodes of the IDTs 23, 25, 27 and 29 are connected to respective ground potentials as shown in FIG. 4.

On the other hand, first comb electrodes of the IDTs 24, 26 and 28 are commonly connected as shown in FIG. 4, to be connected to an output end. Second comb electrodes of the IDTs 24, 26 and 28 are connected to respective ground potentials as shown in FIG. 4.

Figure 3:
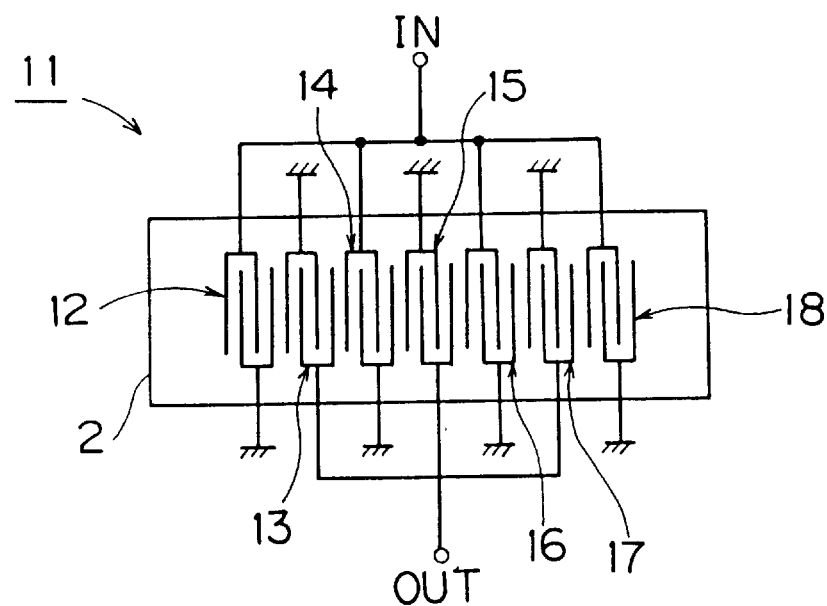
FIG. 3 is a schematic plan view showing a conventional IIDT type SAW filter.

The aforementioned structure is similar to that of the conventional IIDT type SAW filter 11 shown in FIG. 3. The feature of this preferred embodiment resides in that a one-port SAW resonator 30 is connected in parallel with the IIDT type SAW filter part which is formed by the IDTs 23 to 29 on an output side. The one-port SAW resonator 30 includes a pair of comb electrodes 30a and 30b having plural electrode fingers which are interdigitated with each other. The comb electrodes 30a and 30b are connected with the output end and ground potential, respectively.

According to this preferred embodiment, the resonance frequency $f_0$ of the one-port SAW resonator 30 is set at a level lower than the pass band of the IIDT type SAW filter part which includes the IDTs 23 to 29. Therefore, it is possible to increase the amount of attenuation in a frequency region lower than the pass band in filter characteristics of the SAW filter 21.

Figure 5:
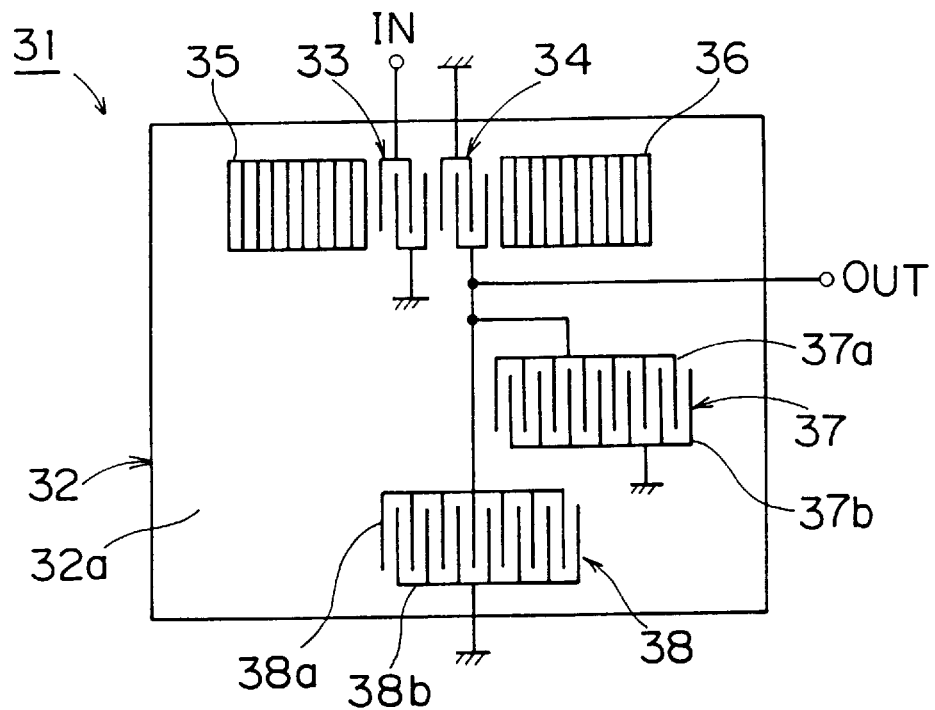
FIG. 5 is a schematic plan view showing a SAW filter according to a second preferred embodiment of the present invention.

FIG. 5 is a schematic plan view showing a SAW filter 31 according to a second preferred embodiment of the present invention.

Figure 1:
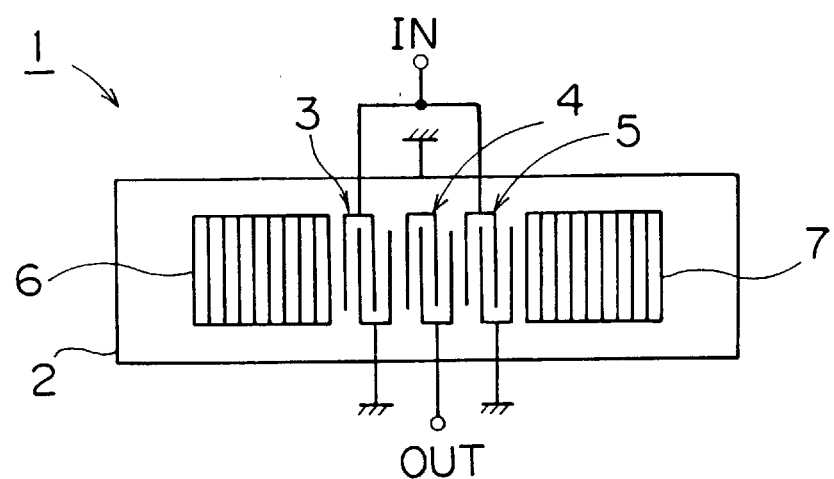
FIG. 1 is a schematic plan view showing a conventional three IDT type SAW filter.
Figure 2:
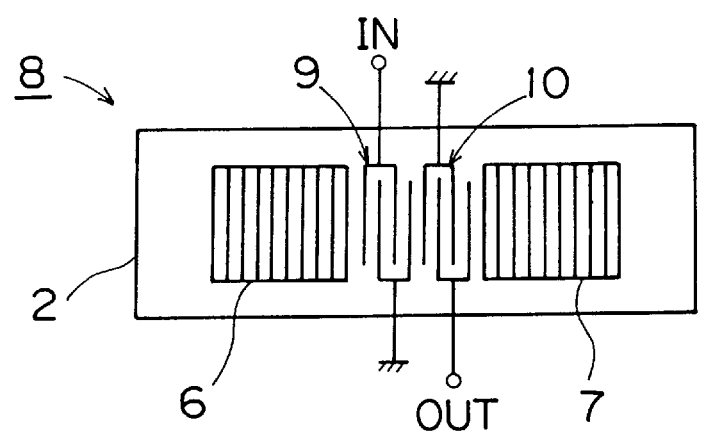
FIG. 2 is a schematic plan view showing a conventional two IDT type SAW filter.

Two IDTs 33 and 34 are arranged on an upper surface 32a of a rectangular piezoelectric substrate 32. First and second comb electrodes of the IDT 33 are connected to an input end and a ground potential, respectively. On the other hand, first and second comb electrodes of the IDT 34 are connected to an output end and a ground potential, respectively. Numerals 35 and 36 denote reflectors. Namely, the IDTs 33 and 34 and the reflectors 35 and 36 compose a structure which is identical to that of the two IDT type SAW filter shown in FIG. 2.

According to this embodiment, two one-port SAW resonators 37 and 38 are connected in parallel with the SAW filter part on the output side. The SAW resonators 37 and 38 have pairs of comb electrodes 37a, 37b, 38a and 38b, respectively, similarly to the SAW resonator 30 according to the first preferred embodiment. The first comb electrodes 37a and 38a are connected to the output end, while the second comb electrodes 37b and 38b are connected to ground potentials.

Also according to the second preferred embodiment, the one-port SAW resonators 37 and 38 are designed so that the resonance frequencies thereof are set at levels lower than the pass band of the two IDTs type SAW filter part. Similarly to the first preferred embodiment, therefore, it is possible to increase the amount of attenuation at a frequency region lower than the pass band since the resonance points of the one-port SAW resonators 37 and 38 are located at frequency levels which are lower than the pass band of the two IDT type SAW filter part.

Figure 6:
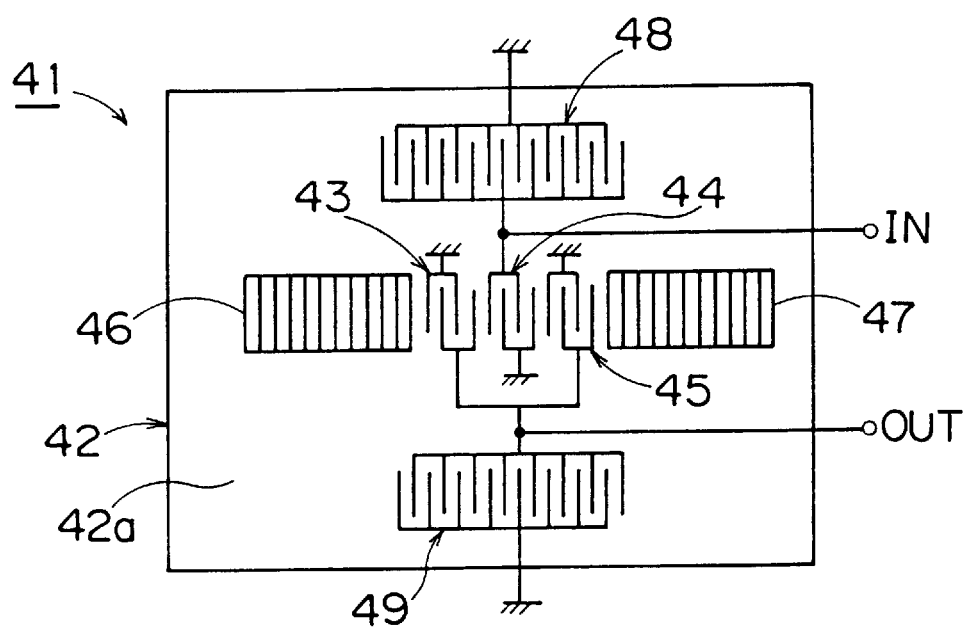
FIG. 6 is a schematic plan view showing a SAW filter according to a third preferred embodiment of the present invention.

FIG. 6 is a schematic plan view showing a SAW filter 41 according to a third preferred embodiment of the present invention. The SAW filter 41 includes a rectangular piezoelectric substrate 42. The piezoelectric substrate 42 is provided on a center of its upper surface 42a with a three IDTs type SAW filter part. Namely, IDTs 43 to 45 are arranged along a surface acoustic wave propagation direction. A first comb electrode of the IDT 44 is connected to an input end, while those of the IDTs 43 and 45 are connected to an output end. Second comb electrodes of the IDTs 43 to 45 are connected to respective ground potentials. Numerals 46 and 47 denote reflectors.

The feature of this preferred embodiment resides in that a single one-port SAW resonator 48 is connected in parallel with the SAW filter part on an input side, while another one-port SAW resonator 49 is connected in parallel with the SAW filter part also on an output side.

The one-port SAW resonators 48 and 49 are structured to have resonance frequencies $f_0$ at levels which are lower than the pass band of the three IDT type SAW filter part which is formed by the IDTs 43 to 45.

Also in the third preferred embodiment, therefore, the amount of attenuation at a level lower than the pass band is increased due to addition of the one-port SAW resonators 48 and 49.

When a plurality of one-port SAW resonators are connected as in the second or third preferred embodiment, it is possible to more completely achieve the desired characteristics of the overall SAW filter by employing SAW resonators having different resonance frequencies and impedances.

The piezoelectric substrates 22, 32 and 42 provided in the first to third preferred embodiments can be formed by well-known piezoelectric ceramic substrates or insulating substrates provided with piezoelectric thin films thereon. In the latter case, respective IDTs and reflectors may be formed on either upper or lower surfaces of the piezoelectric thin films.

The operation principle of the present invention is now described with reference to actual experimental results.

Figure 7:
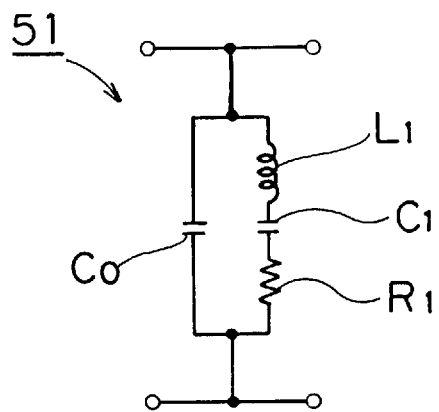
FIG. 7 illustrates an equivalent circuit of a one-port SAW resonator.
Figure 8:
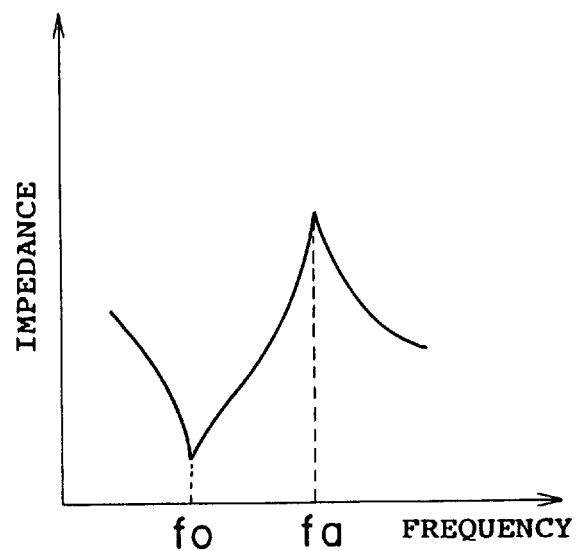
FIG. 8 illustrates impedance-frequency characteristics of the one-port SAW resonator.

In general, a one-port SAW resonator 51 is expressed in an equivalent circuit shown in FIG. 7. Referring to FIG. 7, the one-port SAW resonator 51 has an inductance $L_1$, a capacitance $C_1$ and a resistance $R_1$ which are connected in series with each other, and a capacitance $C_0$ which is connected in parallel with the inductance $L_1$, the capacitance $C_1$ and the resistance $R_1$. FIG. 8 shows impedance-frequency characteristics of this SAW resonator 51. The impedance is minimized in the vicinity of the resonance frequency $f_0$, and maximized in the vicinity of the antiresonance frequency $f_a$.

When such a one-port SAW resonator is connected in parallel with the aforementioned IIDT type, two IDT type or three IDT type SAW filter part on at least one of input and output sides, it is possible to form the pass band without significantly increasing insertion loss by setting the antiresonance frequency $f_a$ of the one-port SAW resonator in the pass band of the SAW filter part.

In the aforementioned case, the input impedance approaches a short-circuited state in the vicinity of the resonance frequency $f_0$ of the one-port SAW resonator, and forms an attenuation pole. Thus, it is possible to increase the amount of attenuation in a frequency region lower than the pass band with the resonance frequency $f_0$.

In this case, the effect of increasing the amount of attenuation is increased as the impedance at the resonance frequency $f_0$ of the one-port SAW resonator as added is reduced. If the impedance at the resonance frequency $f_0$ of the one-port SAW resonator is too small, however, the impedance matching range of the SAW filter is narrowed to deteriorate the insertion loss property. Therefore, it is preferable to design the IDT of the one-port SAW resonator to be added in response to the structure of the SAW filter part.

Assuming that $f_0$ (MHz) represents the resonance frequency of the one-port SAW resonator, N represents the number of pairs of electrode fingers and A ($\mu$m) represents the overlap length, M=(N×A)/$f_0$ is proportionate to a value which is obtained by standardizing the interelectrode capacitance of the SAW resonator by the frequency.

When a plurality of one-port SAW resonators are connected with each other, (N×A)/$f_0$ is obtained every one-port SAW resonator, so that the sum thereof defines the aforementioned value M.

The impedance matching range is narrowed and insertion loss is increased if the aforementioned value M is reduced. The upper limit of insertion loss increased by impedance mismatching is 0.5 dB in practice, and hence it is necessary to suppress increase of insertion loss below this value. Considering temperature characteristics of the piezoelectric substrate, a specific band of at least 1% is necessary.

Figure 9:
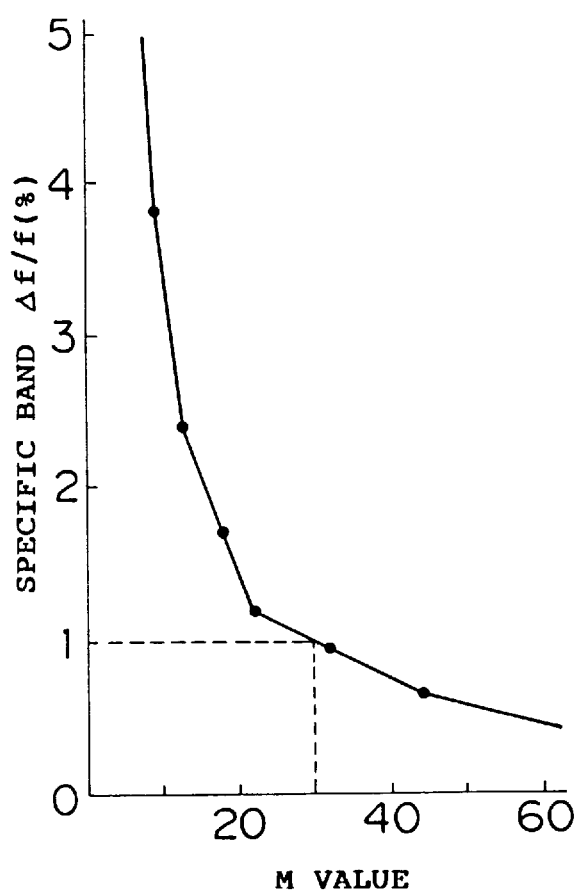
FIG. 9 illustrates changes of insertion loss measured in a 36° Y cut-LiTaO$_3$ substrate while varying M values.

FIG. 9 illustrates a specific band where deterioration of insertion loss is suppressed in a range of up to 0.5 dB upon changes of the value M with respect to a 36° Y cut-LiTaO$_3$ substrate. As clearly understood from FIG. 9, the value M must be not more than 30, in order to ensure the specific band by at least 1%.

Figure 10:
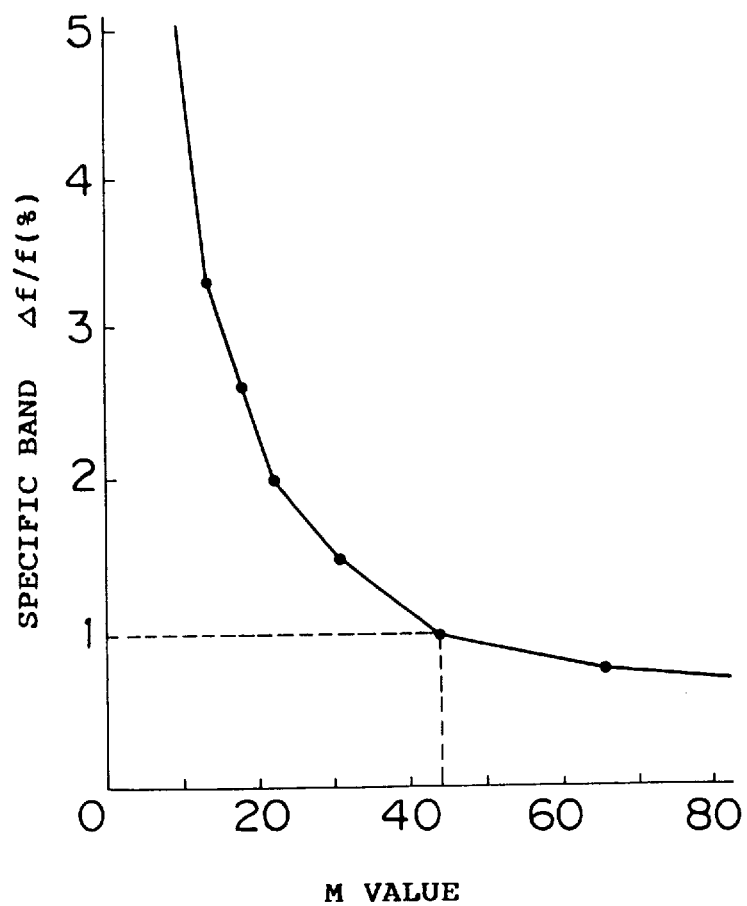
FIG. 10 illustrates changes of insertion loss measured in a 64° Y cut-LiNbO$_3$ substrate while varying M values.

FIG. 10 illustrates changes of insertion loss measured in a 64° Y cut-LiTaO$_3$ substrate while varying the value M. As clearly understood from FIG. 10, it is necessary to reduce the value M to not more than 45, in order to ensure the specific band by at least 1%.

As hereinabove described, the electrode structure of the one-port SAW resonator is preferably designed so that the value M is below a certain value in response to the material for the piezoelectric substrate, in order to avoid increase of insertion loss.

Description is now made of an experimental example of measuring insertion loss-frequency characteristics in a modification of the SAW filter 21 according to the first preferred embodiment shown in FIG. 4. While a single SAW resonator 30 is connected on the output side of the SAW filter 21 according to the first preferred embodiment shown in FIG. 4, FIG. 11 shows insertion loss-frequency characteristics of a SAW filter connected with no such SAW resonator 30.

Figure 11:
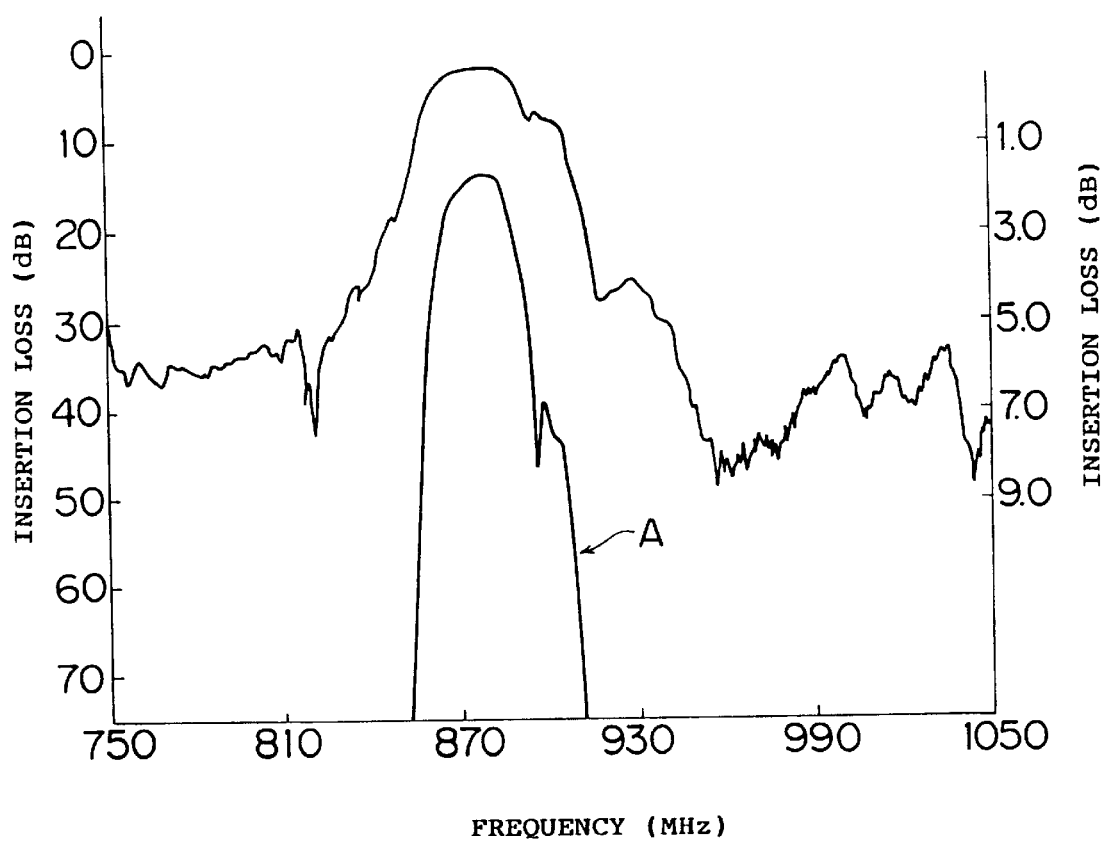
FIG. 11 illustrates insertion loss-frequency characteristics of a conventional SAW filter prepared for the purpose of comparison.
Figure 12:
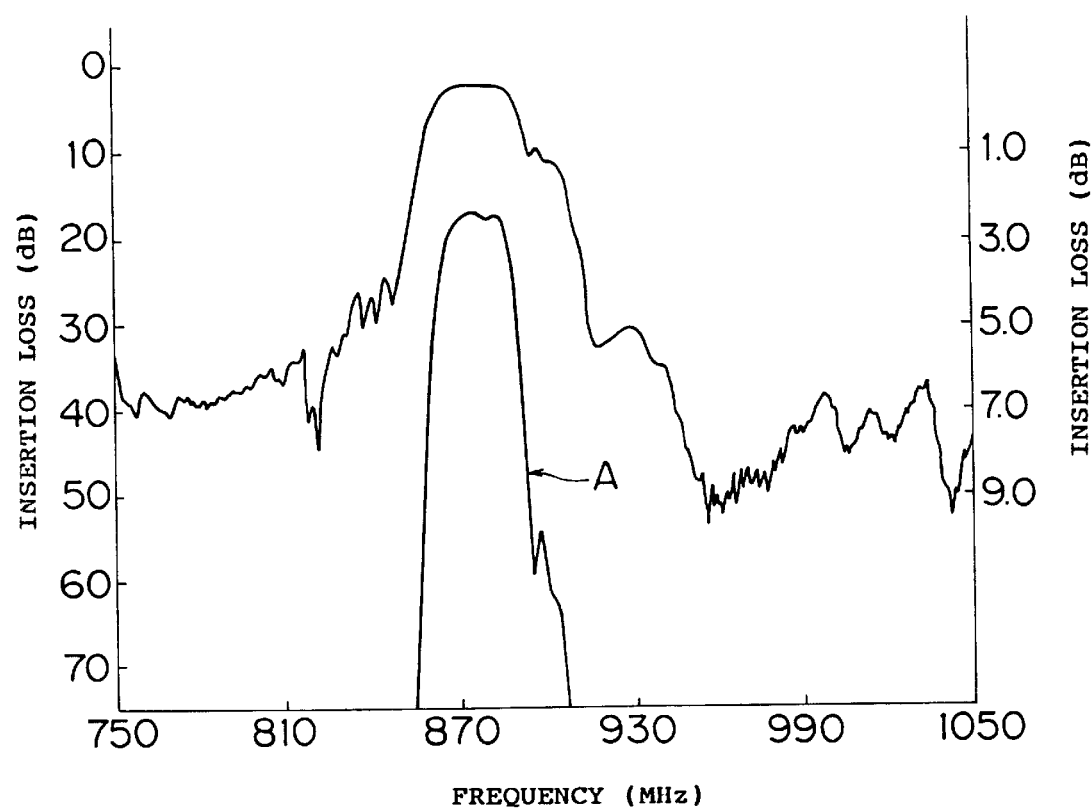
FIG. 12 illustrates insertion loss-frequency characteristics of a SAW filter according to Example connected with four one-port SAW resonators.

A sample of a SAW filter was prepared by connecting four SAW resonators similar to that shown in FIG. 4 on the output side of the SAW filter part having the characteristics shown in FIG. 11, and subjected to measurement of insertion loss-frequency characteristics. FIG. 12 shows the results.

Referring to FIGS. 11 and 12, solid characteristic curves A show principal parts of pass bands in enlarged manners respectively, and values of insertion loss are expressed by scales shown on right sides of these figures.

Comparing FIGS. 11 and 12 with each other, it is clearly understood that the amount of attenuation on a low-pass side of the pass band is improved by about 5 to 10 dB in the structure connected with four one-port SAW resonators.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A surface acoustic wave filter having an input end and an output end, said filter comprising:
    a piezoelectric substrate;
    a plurality of interdigital transducers located on said piezoelectric substrate and arranged along a surface wave propagation direction in a surface wave propagating region, said plurality of interdigital transducers forming a surface acoustic wave filter part having a pass band and having input and output sides directly coupled to said input and output ends of said surface acoustic wave filter, respectively; and
    a one-port SAW resonator, having at least one interdigital transducer and being connected at least between one of said input and output sides of said surface acoustic wave filter part and a ground potential, said one-port SAW resonator being located in a region of the piezoelectric substrate other than said surface wave propagating region,
    a resonance frequency of said one-port SAW resonator being set at a frequency region lower than the pass band of said surface acoustic wave filter part.

2. A surface acoustic wave filter in accordance with claim 1, wherein said one-port SAW resonator is formed on said piezoelectric substrate.

3. A surface acoustic wave filter in accordance with claim 1, wherein said piezoelectric substrate is formed by a 36° Y cut-LiTaO$_3$ substrate,
    said interdigital transducer of said one-port SAW resonator being so structured that the following equation (1) is satisfied when said SAW filter is provided with a single said one-port surface acoustic wave resonator:

$$\frac{N \times A}{f_0} \leq 30 \quad (1)$$

while the sum of (N×A)/f$_0$ of respective said resonators is not more than 30 when a plurality of said one-port SAW resonators are connected in parallel with each other, assuming that f$_0$ (MHz) represents the resonance frequency of said one-port SAW resonator, N represents the number of pairs of electrode fingers, and A (μm) represents an overlap length.

4. A surface acoustic wave filter in accordance with claim 1, wherein said piezoelectric substrate consists of 64° Y cut-LiNbO$_3$,
    said interdigital transducer of said one-port SAW resonator being so structured that the following equation (2) is satisfied when said SAW filter is provided with a single said one-port surface acoustic wave resonator:

$$\frac{N \times A}{f_0} \leq 45 \quad (2)$$

while the sum of (N×A)/f$_0$ of respective said resonators is not more than 45 when a plurality of said one-port SAW resonators are connected in parallel with each other, assuming that f$_0$ (MHz) represents the resonance frequency of said one-port SAW resonator, N represents the number of pairs of electrode fingers, and A (μm) represents an overlap length.

5. A surface acoustic wave filter in accordance with claim 1, wherein said one-port SAW resonator is connected to said surface acoustic wave filter part to be in parallel with said input or output side of said surface acoustic wave filter part.

6. A surface acoustic wave filter in accordance with claim 1, wherein more than two said one-port SAW resonators are connected in parallel with each other to be connected in parallel with said input or output side of said surface acoustic wave filter part.

7. A surface acoustic wave filter in accordance with claim 1, wherein said one-port SAW resonator is connected in parallel with each of said input and output sides of said surface acoustic wave filter part.

8. A surface acoustic wave filter in accordance with claim 1, wherein said surface acoustic wave filter part is formed by a interdigited interdigital type SAW filter.

9. A surface acoustic wave filter in accordance with claim 1, wherein said surface acoustic wave filter part is formed by a two IDTs type SAW filter.

10. A surface acoustic wave filter in accordance with claim 1, wherein said surface acoustic wave filter part is formed by a three IDTs type SAW filter.

* * * * *